(12) United States Patent
Park

(10) Patent No.: US 7,554,864 B2
(45) Date of Patent: Jun. 30, 2009

(54) SEMICONDUCTOR MEMORY DEVICE INCLUDING A GLOBAL INPUT/OUTPUT LINE OF A DATA TRANSFER PATH AND ITS SURROUNDING CIRCUITS

(75) Inventor: Ki Chon Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/778,380

(22) Filed: Jul. 16, 2007

(65) Prior Publication Data
US 2008/0239840 A1    Oct. 2, 2008

(30) Foreign Application Priority Data
Mar. 27, 2007   (KR) ................. 10-2007-0029686
Mar. 27, 2007   (KR) ................. 10-2007-0029687

(51) Int. Cl.
*G11C 7/00*   (2006.01)
*G11C 7/10*   (2006.01)
*G11C 8/00*   (2006.01)

(52) U.S. Cl. .................. 365/193; 365/189.05; 365/191; 365/230.03

(58) Field of Classification Search ............ 365/189.05, 365/189.06, 193, 230.03
See application file for complete search history.

(56) References Cited

U.S. PATENT DOCUMENTS

| | | | |
|---|---|---|---|
| 7,054,220 B2 * | 5/2006 | Kwean ................. | 365/230.08 |
| 2004/0008547 A1 * | 1/2004 | Kwon et al. ............. | 365/193 |
| 2004/0081005 A1 * | 4/2004 | Garrett et al. ............ | 365/200 |
| 2007/0070746 A1 * | 3/2007 | Han ..................... | 365/203 |

FOREIGN PATENT DOCUMENTS

| | | |
|---|---|---|
| KR | 1020000031768 | 6/2000 |
| KR | 1020060026313 | 3/2006 |
| KR | 1020070028074 | 3/2007 |

* cited by examiner

*Primary Examiner*—Ly D Pham
(74) *Attorney, Agent, or Firm*—Ladas & Parry LLP

(57) ABSTRACT

A semiconductor memory device includes an input/output line of a data transfer path and its surrounding circuits, comprising a controller which generates a control signal corresponding to command and address input in read and write operation; and a repeater which selects any one of the plurality of bank groups as the control signal to control data transfer between the selected bank group and an input/output pad.

14 Claims, 9 Drawing Sheets

SEMICONDUCTOR MEMORY DEVICE INCLUDING A GLOBAL INPUT/OUTPUT LINE OF A DATA TRANSFER PATH AND ITS SURROUNDING CIRCUITS

CROSS-REFERENCE TO RELATED APPLICATIONS

The present application claims priority to Korean patent application numbers 10-2007-0029686 filed on Mar. 27, 2007 and 10-2007-0029687 filed on Mar. 27, 2007, which is incorporated herein by reference in its entirety.

BACKGROUND OF THE INVENTION

The present invention relates to a semiconductor memory device, and more particularly to a semiconductor memory device including a global input/output line of a data transfer path and its surrounding circuits.

In general, prior semiconductor memory devices, such as Graphic DDR SDRAM, have a quarter-bank structure as shown in FIG. 1 for high-speed operation.

More specifically, referring to FIG. 1, in the case of an 8-bank (BK0~BK7) structure, each bank BK0~BK7 is dividedly disposed into four regions, in which input/output pads (not shown) and repeaters 10 are disposed between quarter banks BK0~BK7 in an upper portion and quarter banks BK0~BK7 in a lower portion.

Global input/output lines GIO_UP_RPT, GIO_DN_RPT are connected between the input/output pads and the repeaters 10 respectively. The global input/output lines GIO_UP are connected between the quarter banks BK0~BK7 in the upper portion and the repeaters 10 and the global input/output lines GIO_DN are connected between the quarter banks BK0~BK7 in the lower portion and the repeaters 10.

For example, if the semiconductor memory device of FIG. 1 has 32 input/output pads (not shown), the input/output pads are connected to the repeaters 10 corresponding to each region via 16 global input/output lines GIO_UP_RPT and 16 global input/output line GIO_DN_RPT. As a result, 8 global input/output lines (for example, GIO_UP_RPT) are connected to single repeater 10.

A prior semiconductor memory device having such structure as outlined above, if the data is inputted to a certain repeater 10 via the global input/output lines GIO_UP_RPT, GIO_DN_RPT, GIO_UP, GIO_DN, the repeater 10 amplifies the input data and delivers it to a corresponding quarter bank or corresponding input/output pad.

Since the global input/output lines GIO_UP, GIO_DN connecting each quarter bank BK0~BK7 and each repeater 10 are dividedly disposed in each quarter bank region, a length of the global input/output lines GIO_UP, GIO_DN becomes shortened. The shortening results in high speed operation and low consumption of write operation current IDD4W.

However, since each bank BK0~BK7 is dividedly disposed in a quarter, it is necessary to have a bank control block (not shown) for each of the quarter banks BK0~BK7. A bank control block made up of, for example, a row decoder (X-decoder), a column decoder (Y-decoder), an input/output sense amplifier, and a write driver. Therefore the additional bank control block presents disadvantages in that the size of a memory chip becomes larger and the bank control block consumes a large current.

To compensate for these disadvantages of the quarter-bank structure outline above, a conventionally proposed half-bank structure is shown in FIG. 2.

That is, referring to FIG. 2, in the case of 8-bank BK0~BK7 structure, each bank BK0~BK7 is dividedly disposed into 4 regions, in which 4 banks BK0~BK3 are disposed into two upper regions of the 4 regions as half banks BK0~BK3 and 4 banks BK4~BK7 are disposed into two lower regions of the 4 regions as half banks BK4~BK7.

If 32 input/output pads (not shown) are disposed between the upper half banks BK0~BK3 and the lower half banks BK4~BK7, the input/output pads are connected to the repeaters 20 corresponding to each region via 32 global input/output lines GIO_RTP. At this time, single repeater 20 is connected to 16 global input/output lines GIO_RPT.

Further, 16 global input/output lines GIO_COMM connecting the repeaters 20 and the half banks BK0~BK7 are disposed between the 4 half banks BK0, BK1, BK4, BK5 and 4 half banks BK2, BK3, BK6, BK7.

As such, according to the half-bank structure of FIG. 2, the number of the divided banks is reduced by ½ as compared to the quarter-bank structure outlined above. Thus, the number of control blocks (not shown) for controlling each bank may also be reduced by ½. Therefore, advantages can be realized including the size of the memory chip becomes smaller and currents consumed by the bank control block are low.

However, the length of the global input/output line GIO_COMM connecting the half banks BK0~BK7 and the repeaters 20 is almost doubled as compared to the global input/output lines (for example, GIO_UP, GIO_DN of FIG. 1) of the quarter-bank structure.

A problem exists however, if the length of the global input/output line GIO_COMM becomes longer, data access time can increase due to slop data carried on the global input/output line GIO_COMM.

Further, according to the prior semiconductor memory device of a half-bank structure, there is a problem in that the write operational current consumption can increase in correspondence with a length of the global input/output line GIO_COMM. For example, the write operational current consumed by the prior semiconductor memory device of a half-bank structure can almost double as compared with the quarter-bank structure.

Moreover, the prior semiconductor memory device of a half-bank structure is structured such that input/output sense amplifiers (not shown) that amplify data output by the plurality of banks BK0~BK7, share a single global input/output line GIO_COMM. Therefore, since the global input/output line GIO_COMM can be heavily loaded due to the junction of the input/output sense amplifiers, there are problems such that the data access time can increase and simultaneously, the current consumed by the input/output sense amplifier can increase.

SUMMARY OF THE INVENTION

Embodiments of the present invention are directed to a semiconductor memory device capable of obtaining high integration, low power, and high-speed operation.

It is another object of the present invention to improve the size, current consumption, and an operational velocity of the semiconductor memory device by controlling the number of banks dividedly disposed, and a length of a global input/output line in a structure with banks being dividedly disposed.

It is another object of the present invention to improve the current consumption and an operational velocity of the semiconductor memory device by controlling the length of the global input/output line in a half-bank structure.

It is another object of the present invention to improve data access time and current consumption by controlling the number of input/output sense amplifiers and write drivers which share a global input/output line.

In order to achieve these objects, the semiconductor memory device according to one embedment of the present invention comprises a controller which generates a control signal corresponding to command and address input while in read and write operation; and a repeater which selects any one of the plurality of bank groups as the control signal to control data transfer between the selected bank group and an input/output pad.

Preferably, the controller determines a data output state of the banks as read strobe signals controlling a read operation of each of the banks in the read operation in order to output the output signal corresponding to the bank to which the data is outputted, and outputs the control signal corresponding to the bank to which the data is inputted as a bank control signal having bank address information when a data input strobe signal issued by command is enabled in the write operation.

More preferably, the repeater comprises a read repeater which transfers data provided from the bank group selected by the control signal to the input/output pad in the read operation; and a write repeater which transfers data provided from the input/output pad to the bank group selected by the control signal in the write operation.

More preferably, the read repeater included in the repeater comprises a first driving unit that amplifies the data transferred from the bank group selected by the control signal; and a first latch unit that latches a signal output by the first driving unit.

More preferably, the first driving unit included in the read repeater comprises a pull-up unit which pulls up an output end connected to the first latch unit in response to data transferred from the selected bank group; a pull-down unit which pulls down the output end in response to data transferred from the selected bank group; and a switch which connects the pull-up unit and the pull-down unit with the output end respectively, in response to the control signal.

More preferably, the write repeater included in the repeater comprises a driving signal generating unit which outputs a driving signal corresponding to data transferred from the input/output pad in response to the control signal; a second driving unit which drives the data in response to the driving signal; and a second latch unit which latches a signal output by the second driving unit and transfers the latched signal to corresponding bank group.

More preferably, the driving signal generating unit included in the write repeater enables any one of a pull-up driving signal and a pull-down driving signal in correspondence with the data when the control signal is enabled, and the second driving unit pulls up or pulls down a level of the data in response to an output from the driving signal generating unit.

According to another embodiment of the present invention, a semiconductor memory device comprises a first input/output sense amplifying group which amplifies data provided from a first bank group in a read operation to be transferred to a first global input/output line; a second input/output sense amplifying group which amplifies data provided from a second bank group in the read operation and transfers it to a second global input/output line; a first write driver group which amplifies data provided from an input/output pad in a write operation and transfers it to the first global input/output line; a second write driver group which amplifies data provided from the input/output pad in the write operation and transfers it to the second global input/output line; and a data transferring unit which controls data transfer between the input/output pad and the first and second global input/output lines in response to command and address input in the read and write operations.

More preferably, the data transferring unit comprises a controller which generates control signals corresponding to command and address input in the read and write operations; and a repeater which selects any one of the first and second global input/output lines as the control signals to control data transfer between the selected global input/output line and the input/output pad.

More preferably, the controller included in the data transferring unit comprises a read controller which outputs a first control signal controlling selection of the first global input/output line and a second signal controlling selection of the second global input/output line in the read operation, as first and second read strobe signals generated in the read operation; and a write controller which outputs a third control signal controlling selection of the first global input/output line and a fourth control signal controlling selection of the second global input/output line in the write operation, as a data input strobe signal and a bank control signal generated in the write operation.

More preferably, the first read strobe signals control the read operation of banks constituting the first bank group in the read operation respectively, and the second read strobe signals control the read operation of banks constituting the second bank group in the read operation respectively.

More preferably, the read controller selects the first global input/output line by enabling the first control signal when any one of the first read strobe signals is enabled, and selects the second global input/output line by enabling the second control signal when any one of the second read strobe signals is enabled.

More preferably, the data input strobe signal is enabled by command input in the write operation, and the bank address signal has bank address information input in the write operation.

More preferably, the write controller enables any one of the third signal and the fourth signal in accordance with a state of the bank control signal when the data input strobe signal is enabled.

More preferably, the repeater included in the data transferring unit comprises a read repeater which transfers data provided from any one of the first and the second global input/output line to the input/output pad by the first and the second control signal in the read operation; and a write repeater which transfers data provided from the input/output pad to any one of the first and the second write drivers by the third and the fourth control signal in the write operation.

More preferably, the read repeater included in the repeater comprises a first driving unit which amplifies data provided from the first global input/output line in response to the first control signal; a second driving unit which amplifies data provided from the second global input/output line in response to the second control signal; and a first latch unit which latches signal output by the first driving unit and the second driving unit.

More preferably, the first driving unit included in the read repeater comprises a first pull-up unit which pulls up an output end connected to the first latch unit in response to data provided from the first global input/output line; a first pull-down unit which pulls down the output end in response to data provided from the first global input/output line; and a first switch which connects the first pull-up unit and the first pull-down unit with the output end respectively in response to the first control signal.

More preferably, the second driving unit included in the read repeater comprises a second pull-up unit which pulls up an output end connected to the first latch unit in response to data provided from the second global input/output line; a second pull-down unit which pulls down the output end in response to data provided from the second global input/output line; and a second switch which connects the first pull-up unit and the first pull-down unit with the output end respectively in response to the second control signal.

More preferably, the write repeater included in the repeater comprises a first driving signal generating unit which outputs a first pull up driving signal and a first pull down driving signal corresponding to data provided from the input/output pad in response to the third control signal; a second driving signal generating unit which outputs a second pull up driving signal and a second pull down driving signal corresponding to data provided from the input/output pad in response to the fourth control signal;

a third driving unit which drives the data in response to any one of the first pull-up driving signal and the first pull-down driving signal; a fourth driving unit which drives the data in response to any one of the second pull-up driving signal and the second pull-down driving signal;

a second latch unit which latches a signal output by the third driving unit and transfers the latched signal to the first global input/output line; and a third latch unit which latches a signal output by the fourth driving unit and transfers the latched signal to the second global input/output line.

More preferably, the first driving signal generating unit included in the write repeater enables any one of the first pull-up driving signal and the first pull-down driving signal in correspondence with the data when the third control signal is enabled, and the second driving signal generating unit enables any one of the second pull-up driving signal and the second pull-down driving signal in correspondence with the data when the fourth control signal is enabled.

More preferably, the third driving unit and the fourth driving unit included in the write repeater pull up an output end to a power supply voltage level when the first and second pull-up driving signals are enabled, and pull down the output end to a ground voltage level when the first and the second pull-down driving signals are enabled.

According to another aspect of the present invention in order to achieve the objects mentioned above, a semiconductor memory device with input/output pads divided into an up bank group and a down bank group based on a center region, comprises a controller which is disposed in the center region and generates control signals corresponding to command and address input in read and write operations; and a repeater which is disposed in the center region and selects any one of the up bank group and the down bank group as the control signals to control data transfer between the selected bank group and the input/output pad.

More preferably, an input/output line of a data transfer path is connected between each of the bank groups and the repeater, and banks constituting each bank group are disposed in symmetry with respect to the input/output line.

More preferably, the controller comprises a read controller which outputs a first control signal controlling selection of the up bank group and a second control signal controlling selection of the down bank group in the read operation, as first and second read strobe signals generated in the read operation; and a write controller which outputs a third control signal controlling selection of the up bank group and a fourth control signal controlling selection of the down bank group in the write operation, as a data input strobe signal and a bank control signal generated in the write operation.

More preferably, the repeater comprises a read repeater which transfers data provided from the bank group selected by the first and second control signals to the input/output pad in a read operation; and a write repeater which transfers data provided from the input/output pad to bank group selected by the third and fourth control signals in a write operation.

More preferably, the read repeater included in the repeater comprises a first driving unit which amplifies data provided from the up bank group in response to the first control signal; a second driving unit which amplifies data provided from the down bank group in response to the second control signal; and a first latch unit which latches signal output by the first driving unit and the second driving unit.

More preferably, the write repeater included in the repeater comprises a first driving signal generating unit which outputs a first pull up driving signal and a first pull down driving signal corresponding to data provided from the input/output pad in response to the third control signal; a second driving signal generating unit which outputs a second pull up driving signal and a second pull down driving signal corresponding to data provided from the input/output pad in response to the fourth control signal; a third driving unit which drives the data in response to any one of the first pull-up driving signal and the first pull-down driving signal; a fourth driving unit which drives the data in response to any one of the second pull-up driving signal and the second pull-down driving signal;

a second latch unit which latches signal output by the third driving unit and transfers the latched signal to the up bank group; and a third latch unit which latches a signal output by the fourth driving unit and transfers the latched signal to the down bank group.

More preferably, the first driving signal generating unit included in the write repeater enables any one of the first pull-up driving signal and the first pull-down driving signal in correspondence with the data when the third control signal is enabled, and the second driving signal generating unit enables any one of the second pull-up driving signal and the second pull-down driving signal in correspondence with the data when the second control signal is enabled.

More preferably, the third driving unit and the fourth driving unit included in the write repeater pull up an output end to a power supply voltage level respectively, when the first and the second pull-up driving signal are enabled, and pull down the output end to a ground voltage level respectively, when the first and the second pull-down driving signal are enabled.

DESCRIPTION OF SPECIFIC EMBODIMENTS

Hereinafter, preferred embodiments of the present invention will be described in detail with reference to the accompanying drawings.

A preferred embodiment of the present invention is directed to a semiconductor memory device structured such that each bank is dividedly disposed in at least two regions, and the banks divided in each region are divided into groups so as to share a single global input/output line per a group, and is characterized by selecting the corresponding global input/output line in a read operation or a write operation and to deliver data via the selected global input/output line.

Figure 1:
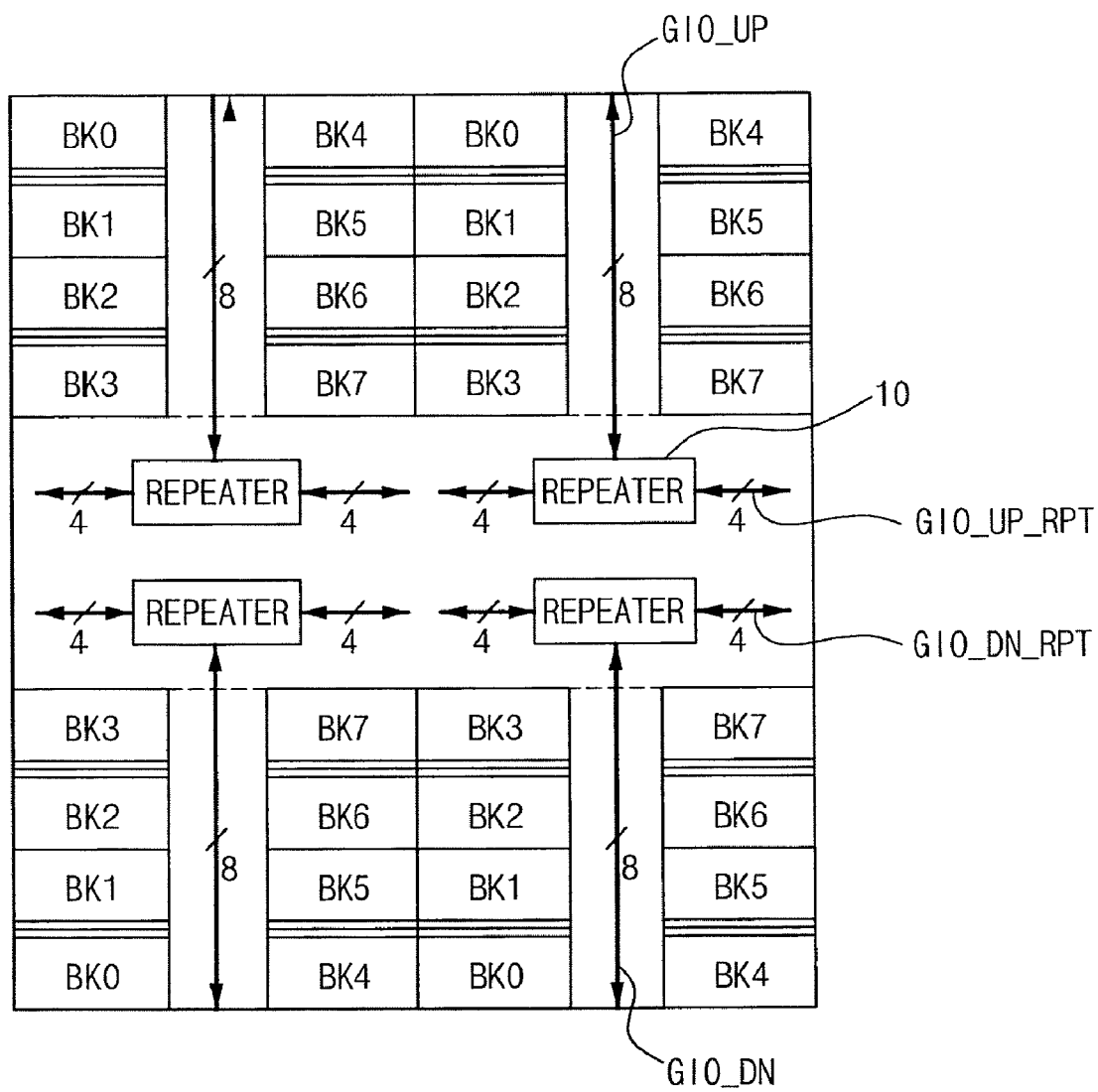
FIG. 1 is a diagram illustrating the disposition of global input/output lines GIO_UP_RPT, GIO_DN_RPT, GIO_UP, GIO_DN in a prior semiconductor memory device of a quarter-bank structure.
Figure 2:
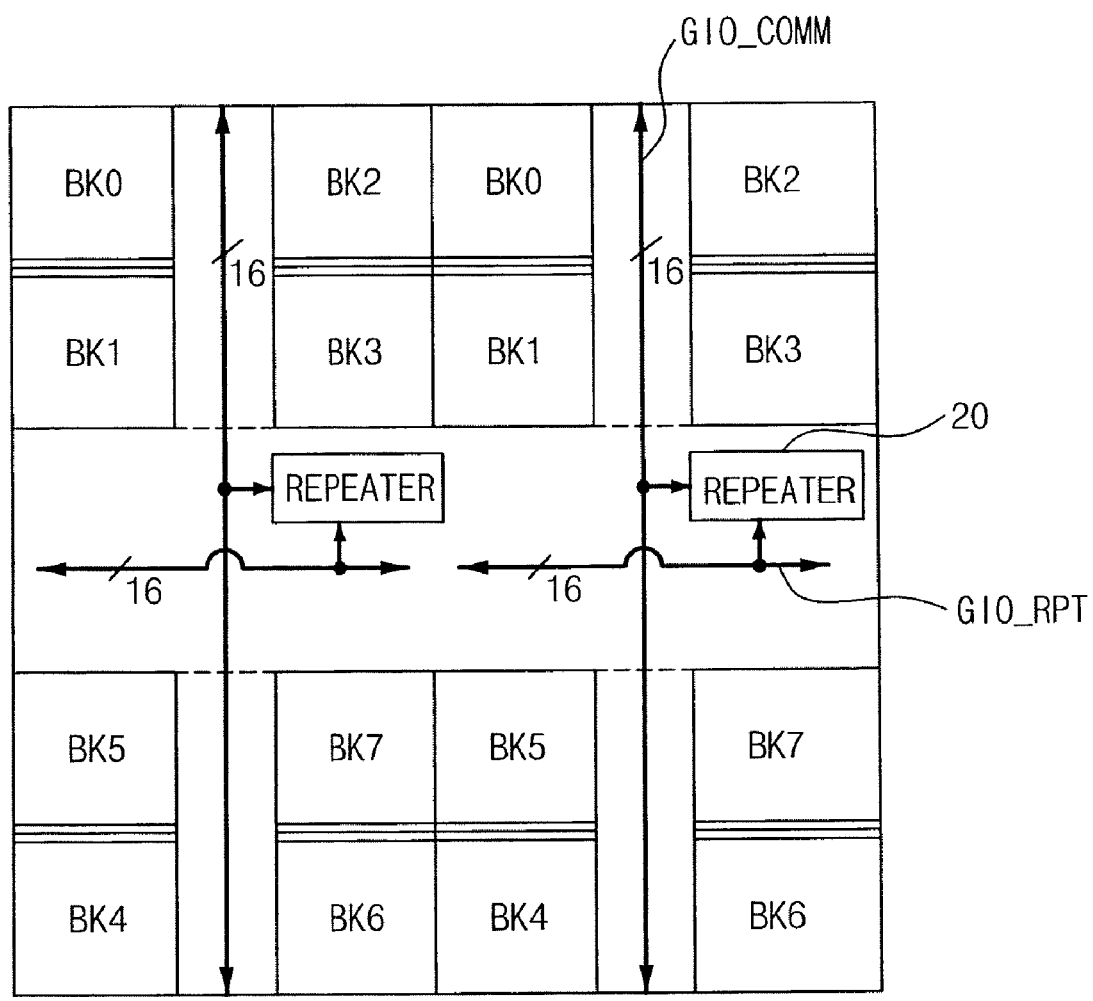
FIG. 2 is a diagram illustrating the disposition of global input/output lines GIO_RPT, GIO_COMM in a prior semiconductor memory device of a half-bank structure.
Figure 3:
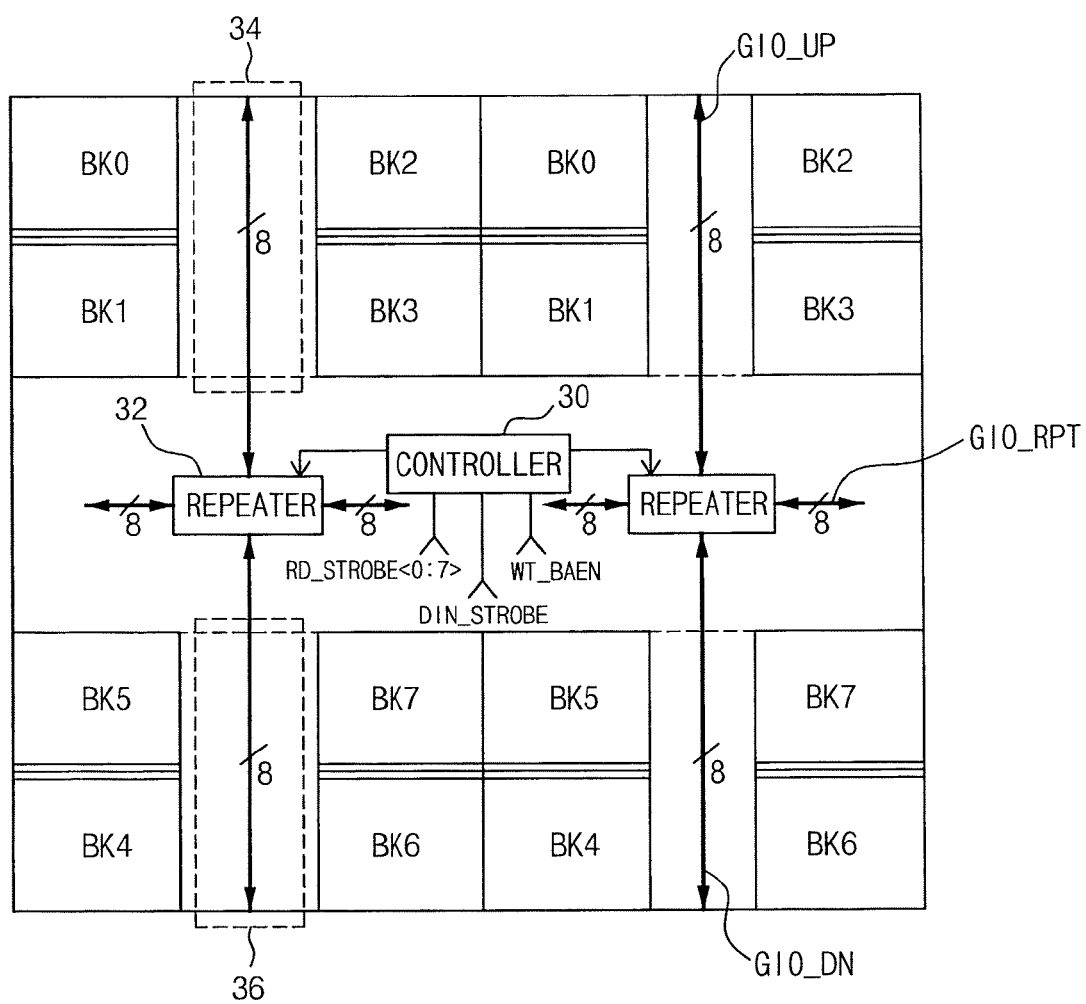
FIG. 3 is a diagram illustrating the disposition of global input/output lines GIO_RPT, GIO_UP, GIO_DN in a prior semiconductor memory device of a half structure.

More specifically, considering a half-bank structure as shown in FIG. 3 as an example, an embodiment of the present invention is structured such that each bank BK0~BK7 is dividedly disposed into two regions in the case of a 8-bank BK0~BK7 structure with the number of input/output pads (not shown) being 32. Each bank BK0~BK7 is dividedly disposed into two regions, the half banks BK0~BK7 divided in each region are divided into an up bank group BK0~BK3 and a down group BK4~BK7 as a basis of a center region in which the input/output pads are disposed.

Eight up-global input/output lines GIO_UP are disposed in a space 34 between two half banks BK0, BK1 and two half banks BK2, BK3 for connecting each half bank BK0~BK3 and the repeater 32 disposed in the center region, and eight down-global input/output lines GIO_DN are disposed in a space 36 between two half banks BK4, BK5 and two half banks BK6, BK7 for connecting each half bank BK4~BK7 and the repeater 32 disposed in the center region.

A data transfer portion consists of a controller 30 and the repeater 32 disposed in a center region for selecting any one of eight up-global input/output lines GIO_UP and eight down-global input/output lines GIO_DN by determining data input/output state with a read strobe signal RD_STROBE<0:7>, a data input strobe signal DIN_STROBE and a bank control signal WT_BAEN.

Herein, the read strobe signal RD_STROBE<0:7> refers to a signal which is generated by command and address input from the outside in the read operation for controlling operations of input/output sense amplifiers described later, the data input strobe signal DIN_STROBE refers to a signal which is enabled by a command input from the outside in the write operation, and the bank control signal WT_BAEN refers to a signal having bank address information input from the outside in the write operation.

The is one controller 30 disposed per the repeater 32, or one per at least two repeaters 22, or only one for the semiconductor chip.

Further, the number of the repeaters 32 can be varied depending on the prefetch operation of the memory. For example, if the semiconductor memory device operates with 4-bit prefetch, 4-bit data is inputted/outputted at one time in each half bank BK4~BK7 and thus four repeaters 32 are connected between one up-global input/output line GIO_UP and one down-global input/output line GIO_DN respectively. Therefore, a total of 128 repeaters 32 can be disposed in the case of 4-bit prefetch.

Meanwhile, each repeater 32 is connected to 16 input/output pads (not shown) that are disposed in the center region via 16 global input/output lines GIO_RPT.

According to an embodiment of the present invention having such a structure, the data output by each half bank BK0~BK7 in the read operation are transferred to the repeater 21 via the input/output sense amplifiers disposed in spaces 34, 36 between banks facing each other, while the data output by each repeater 32 in the write operation are transferred to each half bank BK0~BK7 via the write drivers disposed in spaces 34, 36 between banks facing each other.

Figure 4:
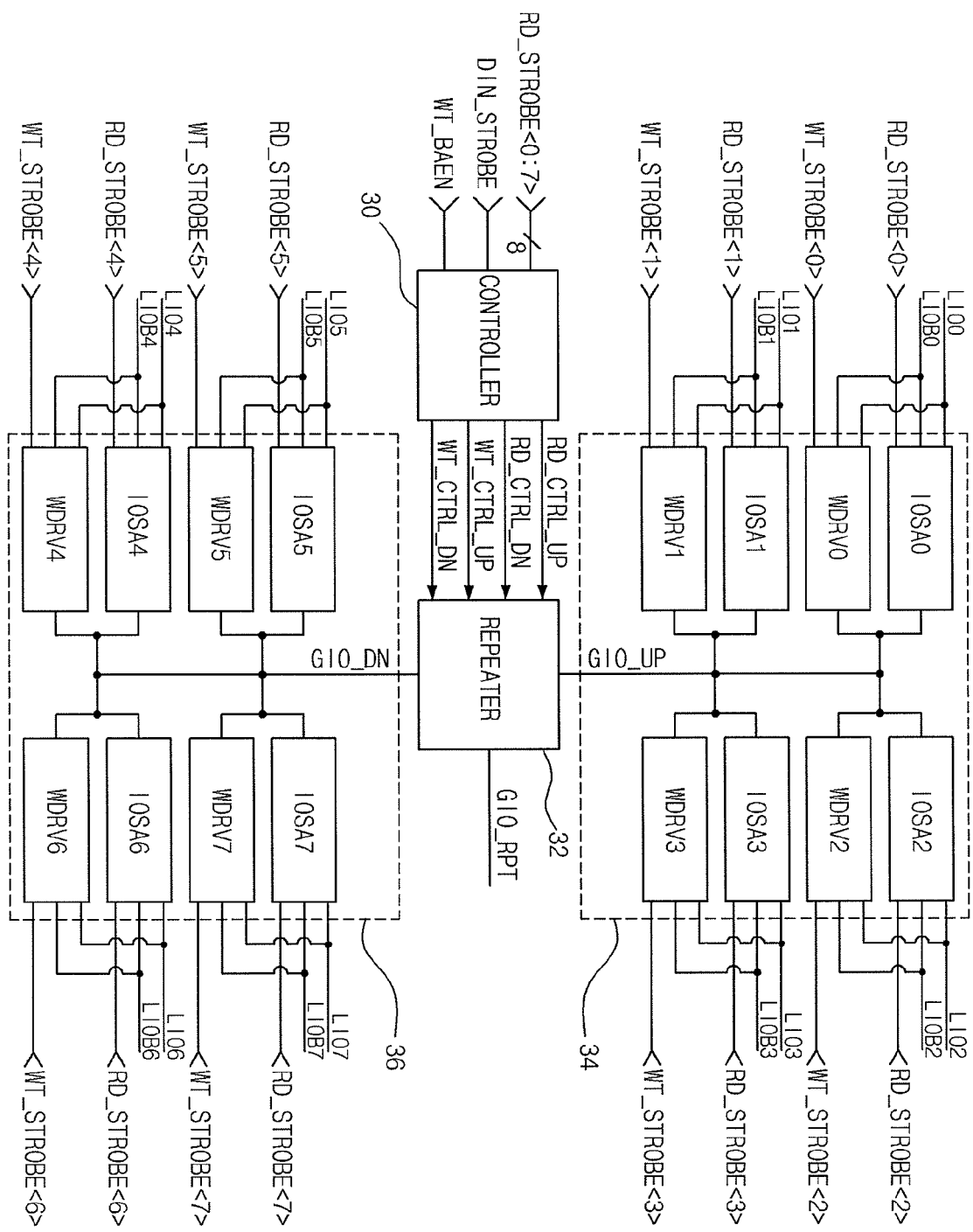
FIG. 4 is a block diagram showing circuits disposed in spaces 34, 36 between banks of FIG. 3 facing each other and the connection relation between a controller 30 and a repeater 32.

More specifically, referring to FIG. 4, four input/output sense amplifiers IOSA0~IOSA3 and four write drivers WDRV0~WDRV3 corresponding to up bank group BK0~BK3 are disposed in the space 34 between two half banks BK0, BK1 and two half banks BK2, BK3. Further, four input/output sense amplifiers IOSA4~IOSA7 and four write drivers WDRV4~WDRV7 corresponding to down bank group BK4~BK7 are disposed in the space 36 between two half banks BK4, BK5 and two half banks BK6, BK7.

Herein, four input/output sense amplifiers IOSA0~IOSA3 amplify data provided from any one pair of a plurality of local input/output line pairs LIO0, LIOB0, LIO1, LIOB1, LIO2, LIOB2, LIO3, LIOB3 to deliver it to the up-global input/output line GIO_UP, in response to the read strobe signal RD_STROBE<0:3>. Further, four input/output sense amplifiers IOSA4~IOSA7 amplify data provided from any one pair of a plurality of local input/output line pairs LIO4, LIOB4, LIO5, LIOB5, LIO6, LIOB6, LIO7, LIOB7 to deliver it to the down-global input/output line GIO_DN, in response to the read strobe signal RD_STROBE<4:7>.

Four write drivers WDRV0~WDRV3 deliver data provided from the up-global input/output line WGIO_UP to any one pair of a plurality of local input/output line pairs LIO0, LIOB0, LIO1, LIOB1, LIO2, LIOB2, LIO3, LIOB3, in response to write strobe signals WT_STROBE<0:3>. Further, four write drivers WDRV4~WDRV7 deliver data provided from the down-global input/output line WGIO_DN to any one pair of a plurality of local input/output line pairs LIO4, LIOB4, LIO5, LIOB5, LIO6, LIOB6, LIO7, LIOB7, in response to write strobe signals WT_STROBE<4:7>. Herein, write strobe signals WT_STROBE<0:7> inputted to each write driver WDRV0~WDRV7 refer to signals which are enabled by commands and bank addresses input from the outside in the write operation.

Meanwhile, when the data is outputted by the input/output sense amplifiers IOSA0~IOSA7 or the data is inputted to the write drivers WDRV0~WDRV7, the controller 30 and the repeater 32 can be structured, as described later, for selecting any one of the up-global input/output line GIO_UP and the down-global input/output line GIO_DN.

Figure 5:
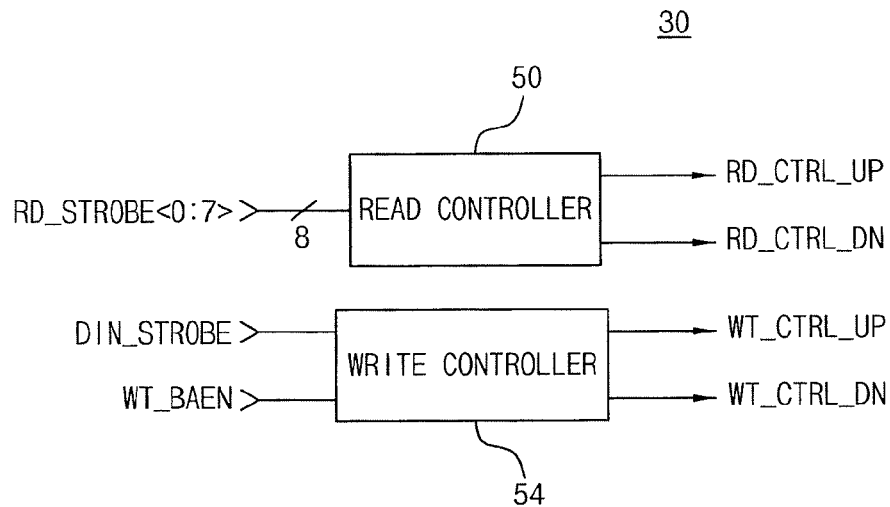
FIG. 5 is a block diagram illustrating one example of the detailed structure of a controller 30 of FIG. 4.

First, referring to FIG. 5, the controller 30 may be composed of a read controller 50 which enables any one of two control signals RD_CTRL_UP, RD_CTRL_DN in response to read strobe signal RD_STROBE<0:7> in the read operation, and a write controller 54 which enables any one of two control signals WT_CTRL_UP, WT_CTRL_DN in response to data input strobe signal DIN_STROBE and bank control signal WT_BAEN in the write operation.

Figure 6:
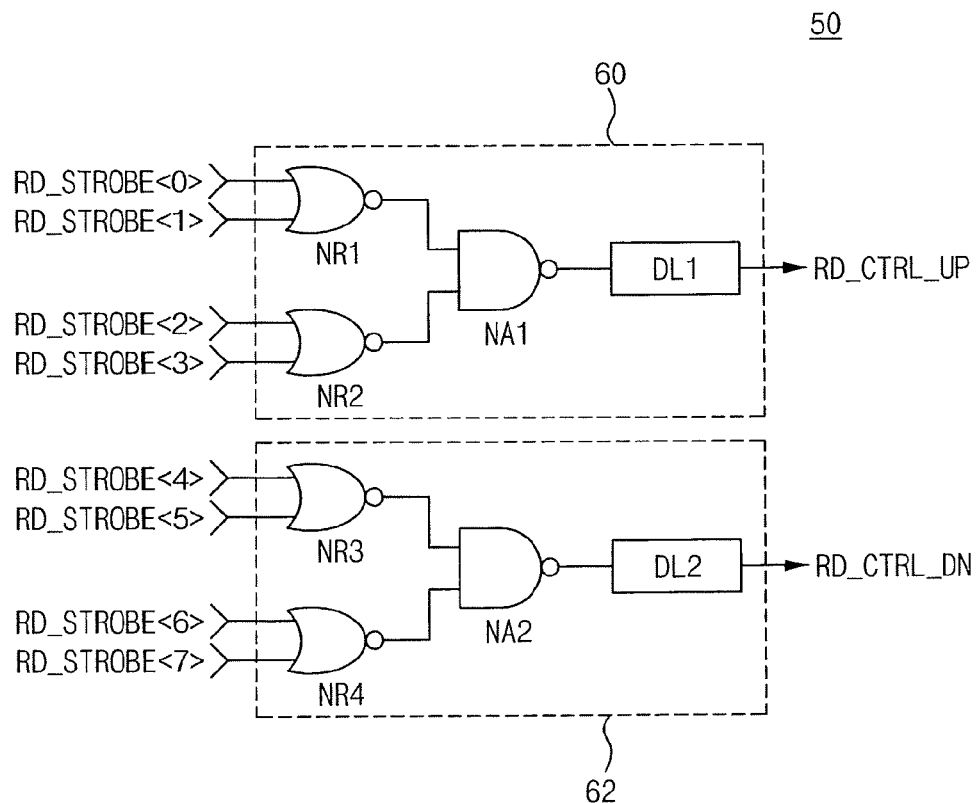
FIG. 6 is a circuit diagram illustrating a detailed description of a read controller 50 of FIG. 5.

The read controller 50, referring to FIG. 6, may be composed of an up controller 60 which enables the control signal RD_CTRL_UP in response to read strobe signals RD_STROBE<0:3> and a down controller 62 which enables the control signal RD_CTRL_DN in response to read strobe signals RD_STROBE<4:7>.

Moreover, the up controller 60 can be composed of a NOR gate NR1 which NOR-combines a read strobe signal RD_STROBE<0> and a read strobe signal RD_STROBE<1>, and a NOR gate NR2 which NOR-combines a read strobe signal RD_STROBE<2> and a read strobe signal RD_STROBE<3>, a NAND gate NA1 which NAND-combines the signals outputted by the two NOR gates NR1, NR2, and a delay element DL1 which delays a signal output by the NAND gate NA1 to be outputted as a control signal RGIO_CTRL_UP.

Herein, the delay element DL1 preferably delays the control signal RD_CTRL_UP by a time until the data output by the input/output sense amplifier (e.g., IOSA0) reaches the repeater 32 via the up-global input/output line GIO_UP in order to secure a margin of data.

Further, the down controller 62 may be composed of a NOR gate NR3 which NOR-combines a read strobe signal RD_STROBE<4> and a read strobe signal RD_STROBE<5>, and a NOR gate NR4 which NOR-combines a read strobe signal RD_STROBE<6> and a read strobe signal RD_STROBE<7>, a NAND gate NA2 which NAND-combines the signals outputted by the two NOR gates NR3, NR4, and a delay element DL2 which delays a signal output by the NAND gate NA2 to be outputted as a control signal RGIO_CTRL_DN.

Herein, the delay element DL2 preferably delays the control signal RD_CTRL_DN by a time until the data output by the input/output sense amplifier (e.g., IOSA4) reaches the repeater 32 via the down-global input/output line GIO_DN in order to secure a margin of data.

Figure 7:
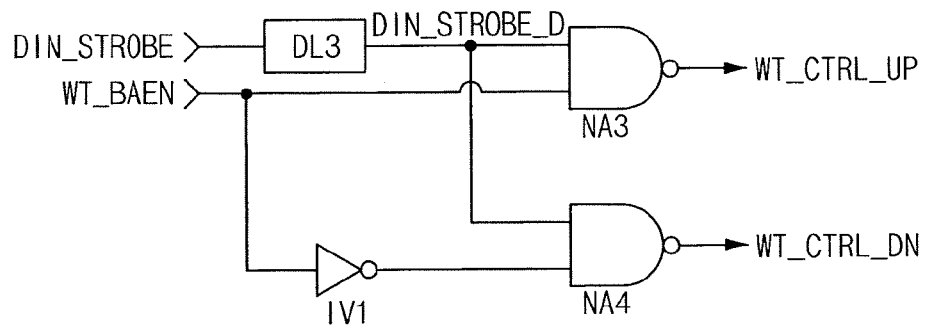
FIG. 7 is a circuit diagram illustrating one example of detailed structure of a write controller 54 of FIG. 5.

The write controller 54, referring to FIG. 7, may be composed of a delay element DL3 which delays the data input strobe signal DIN_STROBE to be outputted as a delay data input strobe signal DIN_STROBE_D, a NAND gate NA3 which NAND-combines a delay data input strobe signal DIN_STROBE_D and the bank control signal WT_BAEN to be outputted as a control signal WT_CTRL_UP, an inverter IV1 which inverts the bank control signal WT_BAEN, and a NAND gate NA4 which NAND-combines the delay data input strobe signal DIN_STROBE_D and a signal output by the inverter IV1 to be outputted as a control signal WT_CTRL_DN.

Herein, the delay element DL3 preferably delays the data input strobe signal DIN_STROBE by a time until the data input via the input/output pad reaches the repeater 32 via the global input/output line GIO_RPT in order to secure a margin of data.

Figure 8:
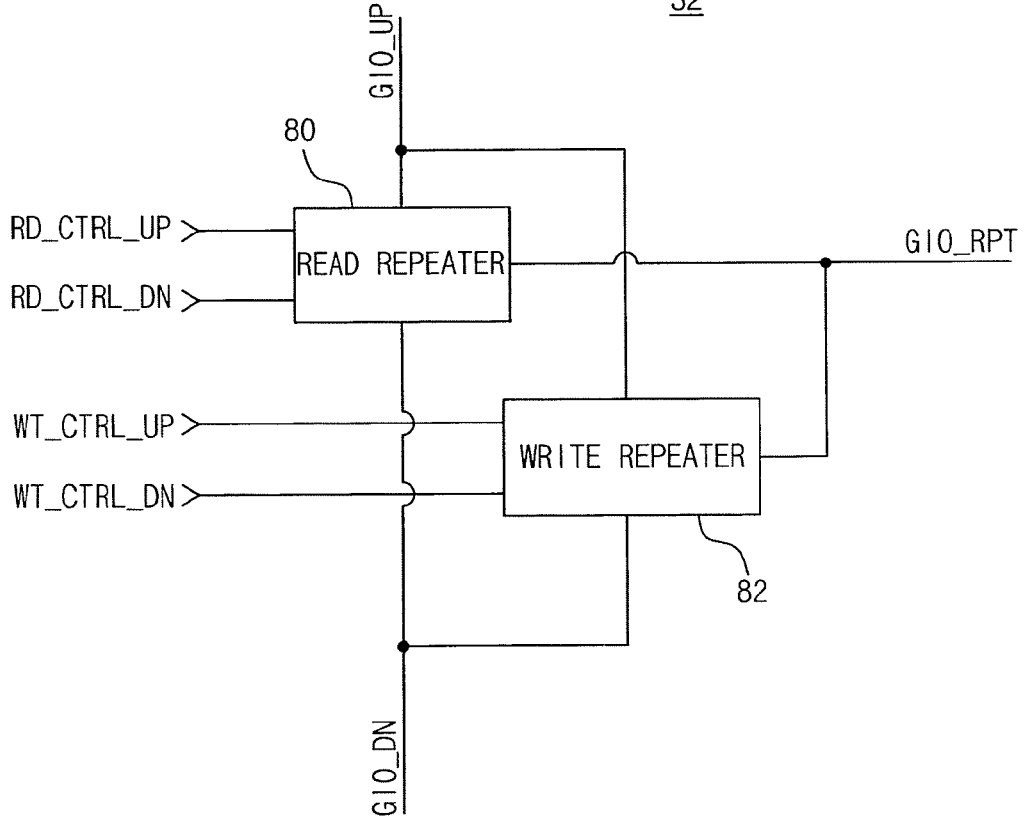
FIG. 8 is a block diagram illustrating one example of detailed structure of a repeater 32 of FIG. 4.

Next, the repeater 32, referring to FIG. 8, may be composed of a read repeater 80 which transfers the data input via the up or down-global input/output lines GIO_UP, GIO_DN to the global input/output line GIO_RPT in response to the control signal RD_CTRL_UP or the control signal RD_CTRL_DN outputted by the controller 30 in the read operation, and a write repeater 82 which transfers the data input via the global input/output line GIO_RPT to the up or down-global input/output line GIO_UP, GIO_DN in response to the control signal WT_CTRL_UP or the control signal WT_CTRL_DN outputted by the controller 30 in the write operation.

The read repeater 80 amplifies and latches the data transferred from the up-global input/output line GIO_UP to be transferred to the global input/output line GIO_RPT if the control signal RD_CTRL_UP is enabled, and amplifies and latches the data transferred from the down-global input/output line GIO_UP to be transferred to the global input/output line GIO_RPT if the control signal RD_CTRL_DN is enabled.

Figure 9:
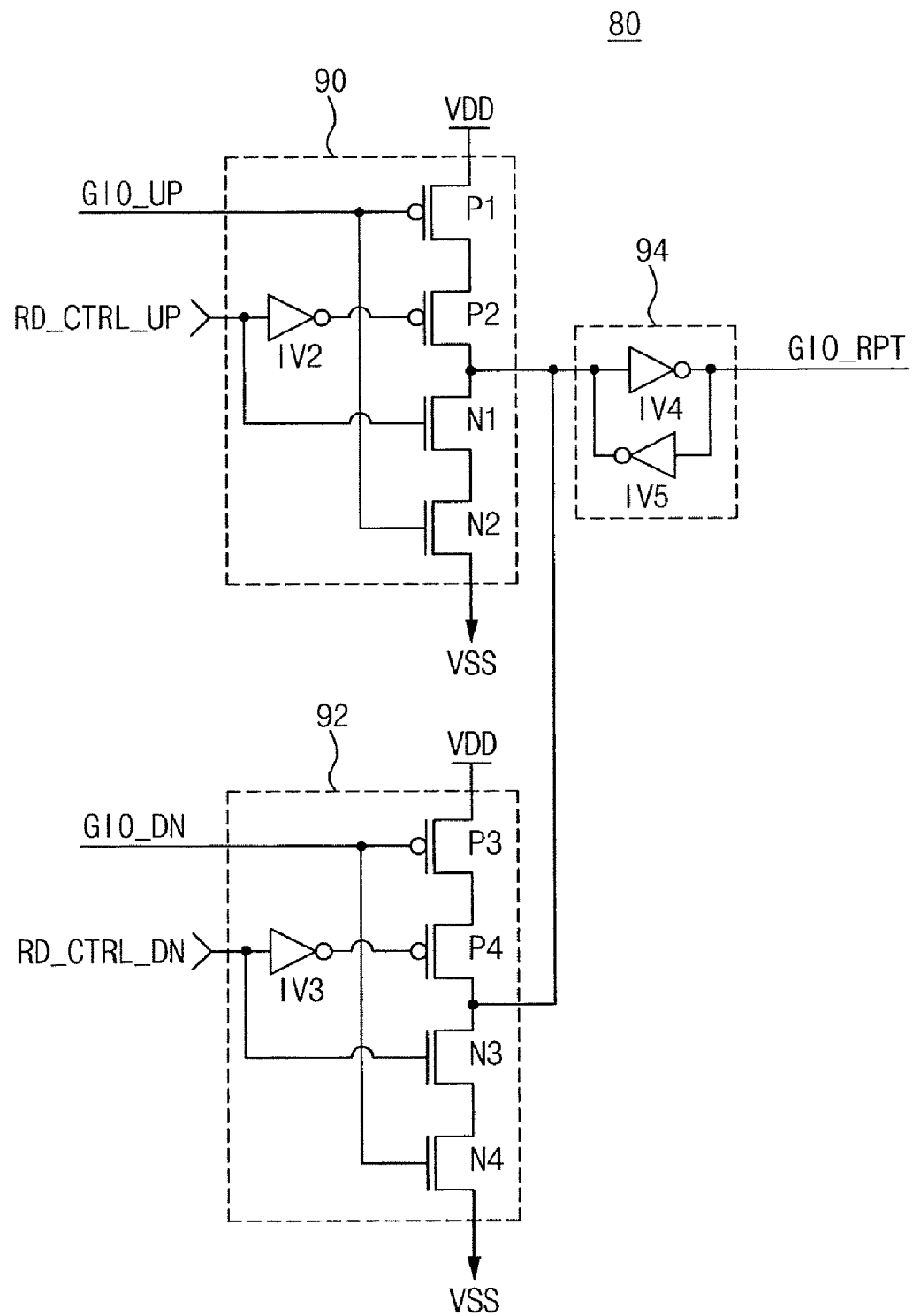
FIG. 9 is a block diagram illustrating one example of detailed structure of a read repeater 80 of FIG. 8.

The read repeater 80 may be composed as shown in FIG. 9, to amplify and latch the data transferred from the up or down-global input/output lines GIO_UP, GIO_DN in response to the control signals RD_CTRL_UP, RD_CTRL_DN.

Referring to FIG. 9, the read repeater 80 may be composed of a driving unit 90 which amplifies the data transferred form the up-global input/output line GIO_UP in response to the control signal RD_CTRL_UP, a driving unit 92 which amplifies the data transferred from the down-global input/output line GIO_DN in response to the control signal RD_CTRL_DN, and a latch unit 94 which latches the data output by both of the driving unit 90, 92.

The driving unit 90 includes a pull-up unit which performs a pull-up operation in response to the data transferred from the up-global input/output line GIO_UP, a pull-down unit which performs a pull-down operation in response to the data transferred from the down-global input/output line GIO_DN, and a switch which connects the pull-up unit and the pull-down unit with an output end respectively, in response to the control signal RD_CTRL_UP.

Herein, the pull-up unit includes a PMOS transistor P1 that pulls up one end of the PMOS transistor P2 to a power supply voltage level VDD in response to the data transferred from the up-global input/output line GIO_UP.

And, the pull-down unit includes a NMOS transistor N2 which pulls down one end of the NMOS transistor N1 to a ground voltage level VSS in response to the data transferred from the down-global input/output line GIO_DN.

Further, the switch includes an inverter IV2 which inverts the control signal RD_CTRL_UP, a PMOS transistor P2 which switches between the PMOS transistor P1 and the output end in accordance with a state of the signal output by the inverter IV2, and a NMOS transistor N1 which switches between the output end and the NMOS transistor N1 in accordance with a state of the control signal RD_CTRL_UP.

The driving unit 92 includes a pull-up unit which performs a pull-up operation in response to the data transferred from the down-global input/output line GIO_DN, a pull-down unit which performs a pull-down operation in response to the data transferred from the down-global input/output line GIO_DN, and a switch which connects the pull-up unit and the pull-down unit with the output end respectively in response to the control signal RD_CTRL_DN.

Herein, the pull-up unit includes a PMOS transistor P3 that pulls up one end of the PMOS transistor P4 to a power supply voltage level VDD in response to the data transferred from the down-global input/output line GIO_DN.

And, the pull-down unit includes a NMOS transistor N4 which pulls down one end of the NMOS transistor N3 to a ground voltage level VSS in response to the data transferred from the down-global input/output line GIO_DN.

Further, the switch includes an inverter IV3 which inverts the control signal RD_CTRL_DN, a PMOS transistor P4 which switches between the PMOS transistor P3 and the output end in accordance with a state of the signal output by the inverter IV3, and a NMOS transistor N3 which switches between the output end and the NMOS transistor N4 in accordance with a state of the control signal RD_CTRL_DN.

The latch unit 94, referring to FIG. 9, may be composed of two inverters IV4, IV5 which are connected in a latch structure between a common output end of both driving units 90, 92 and the global input/output line GIO_RPT. Herein, an input end of the inverter IV4 is connected to an output end of the inverter IV5, and an output end of the inverter IV4 is connected to an input end of the inverter IV5.

Figure 10:
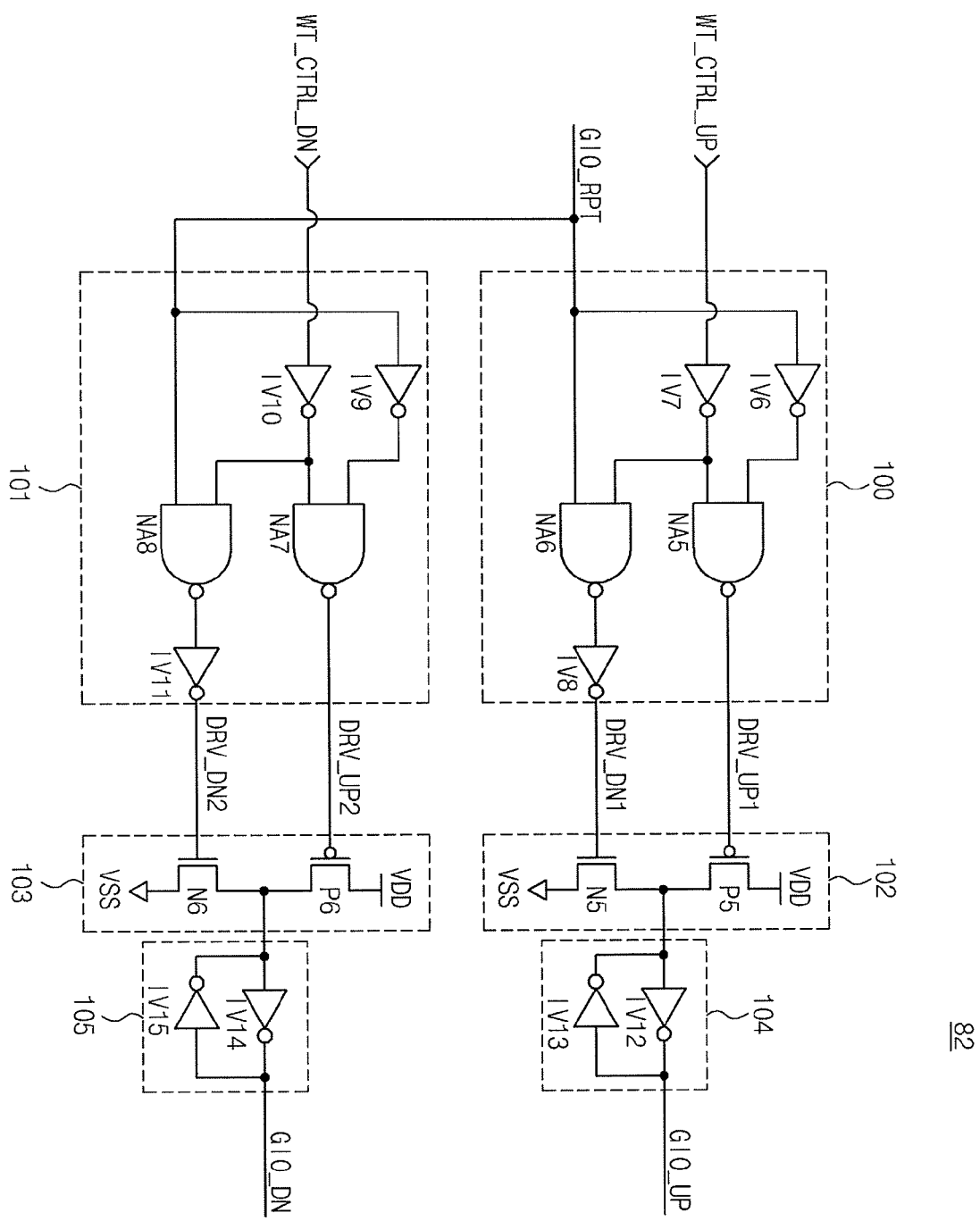
FIG. 10 is a block diagram illustrating one example of detailed structure of a write repeater 82 of FIG. 8.

The write repeater 82, referring to FIG. 10, may be composed of two driving signal generators 100, 101, two driving units 102, 103, and two latch units 104, 105, as shown in FIG. 10.

The driving signal generator 100 outputs a pull-up driving signal DRV_UP1 and a pull-down driving signal DRV_DN1 which correspond to data transferred from the global input/output line GIO_RPT in response to the control signal WT_CTRL_UP.

The driving signal generator 100 generating the pull-up driving signal DRV_UP1 and the pull-down driving signal DRV_DN1 may be composed of an inverter IV6 which inverts the data transferred from the global input/output line GIO_RPT, an inverter IV7 which inverts the control signal WT_CTRL_UP, a NAND gate NA5 which NAND-combines a signal output by the inverter IN6 and a signal output by the inverter IV7 to be outputted as the pull-up driving signal DRV_UP1, a NAND gate NA6 which NAND-combines a signal output by the inverter IN7 and a signal output by the global input/output line GIO_RPT, and an inverter IV8 which inverts a signal output by the NAND gate NA6 to be outputted as the pull-down driving signal DRV_DN1.

Further, the driving signal generating unit 101 outputs a pull-up driving signal DRV_UP2 and a pull-down driving signal DRV_DN2 which correspond to the data transferred form the global input/output line GIO_RPT in response to the control signal WT_CTRL_DN.

The driving signal generator 101 generating the pull-up driving signal DRV_UP2 and the pull-down driving signal DRV_DN2 may be composed of an inverter IV9 which inverts the data transferred from the global input/output line GIO_RPT, an inverter IV10 which inverts the control signal WT_CTRL_DN, a NAND gate NA7 which NAND-combines a signal output by the inverter IN9 and a signal output by the inverter IV10 to be outputted as the pull-up driving signal DRV_UP2, a NAND gate NA8 which NAND-combines a signal output by the inverter IN10 and the data transferred from the global input/output line GIO_RPT, and an inverter IV11 which inverts a signal output by the NAND gate NA8 to be outputted as the pull-down driving signal DRV_DN2.

The driving unit 102 drives the data in response to any one of the pull-up driving signal DRV_UP1 and the pull-down driving signal DRV_DN1.

The driving unit 102 controlled by the pull up driving signal DRV_UP1 and the pull down driving signal DRV_DN1 may be composed of a PMOS transistor P5 which pulls up an output end to a power supply voltage level VDD in response to the pull up driving signal DRV_UP1 and a NMOS transistor N5 which pulls down an output end to a ground voltage level VSS in response to the pull down driving signal DRV_DN1.

Further, the driving unit 103 drives the data in response to any one of the pull-up driving signal DRV_UP2 and the pull-down driving signal DRV_DN2.

The driving unit 103 controlled by the pull up driving signal DRV_UP2 and the pull down driving signal DRV_DN2 may be composed of a PMOS transistor P6 which pulls up an output end to a power supply voltage level VDD in response to the pull up driving signal DRV_UP1 and a NMOS transistor N6 which pulls down an output end to a ground voltage level VSS in response to the pull down driving signal DRV_DN1.

The latch unit 104 latches the data output by the driving unit 102 and transfers the latched data to the up-global input/output line GIO_UP.

The latch unit 104 latching the data driven via the driving unit 102 may be composed of an inverter IV12 which inverts the data output by the driving unit 102 to be transferred to the up-global input/output line GIO_UP, and an inverter IV13 which inverts the data transferred to the up-global input/output line GIO_UP to be transferred to the output end of the driving unit 102.

Further, the latch unit 105 latches the data output by the driving unit 103 and transfers the latched data to the down-global input/output line GIO_DN.

The latch unit 105 latching the data driven via the driving unit 103 may be composed of an inverter IV14 which inverts the data output by the driving unit 103 to transfer it to the down-global input/output line GIO_DN, and an inverter IV15 which inverts the data transferred to the down-global input/output line GIO_DN to transfer it to the output end of the driving unit 103.

Hereinafter, a read operation and a write operation of an embodiment of the present invention as mentioned above will be described referring to FIGS. 11 and 12.

Figure 11:
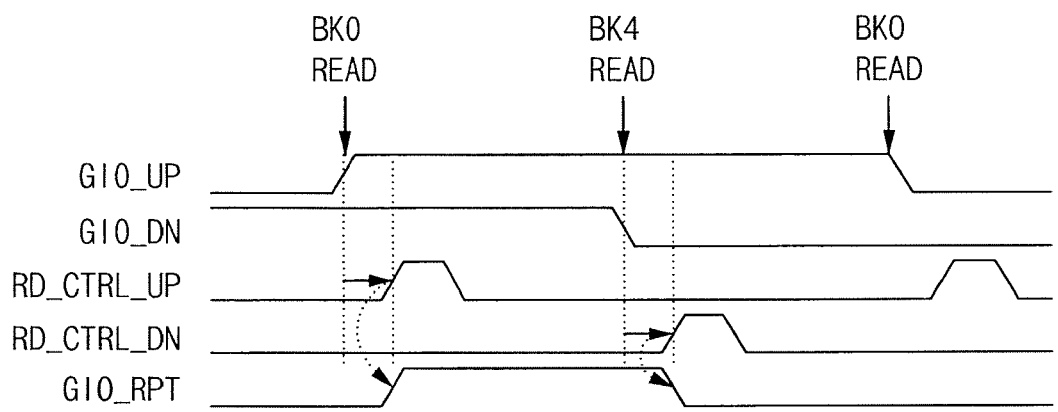
FIG. 11 is a waveform diagram illustrating states of the global input/output lines GIO_UP, GIO_DN, GIO_RPT and the control signals RD_CRTL_UP, RD_CTRL_DN in a read operation of the semiconductor memory device of the present invention.

First, referring to FIG. 11, when a bank BK0 read command is issued by external command and address in the read operation, the data stored on the corresponding memory cell of bank BK0 is transferred to the input/output sense amplifier IOSA0 via the local input/output line pair LIO0, LIOB0.

Then, the read strobe signal RD_STROBE<0> is enabled so that the data is amplified via the input/output sense amplifier IOSA0 and transferred to the up-global input/output line GIO_UP. At this time, if the data is a high level, the up-global input/output line GIO_UP is raised to a high level.

As the read strobe signal RD_STROBE<0> is enabled, the control signal RD_CTRL_UP is delayed by a prescribed time and then enabled via the controller 30.

If the control signal RD_CTRL_UP is enabled, the data transferred from the up-global input/output line GIO_UP is amplified via the repeater 32, and then outputted to the outside via the input/output pad by way of the global input/output line GIO_RPT.

A bank BK4 read command is issued by the external command and address after a prescribed time since the bank BK0 read operation is finished, the low level data of the bank BK4 is transferred to the input/output sense amplifier IOSA4, and then the data is amplified via the input/output sense amplifier IOSA0 and transferred to the down-global input/output line GIO_DN.

Further, as the read strobe signal RD_STROBE<4> is enabled, the control signal RD_CTRL_DN is delayed by a prescribed time and then enabled via the controller 30.

If the control signal RD_CTRL_UP is enabled, the data transferred from the down-global input/output line GIO_DN is amplified via the repeater 32 and then transferred to the global input/output line GIO_RPT, so that the global input/output line GIO_RPT is lowered from a high level to a low level. Therefore, the low level data of the global input/output line GIO_RPT is outputted to the outside via the corresponding input/output pad.

Figure 12:
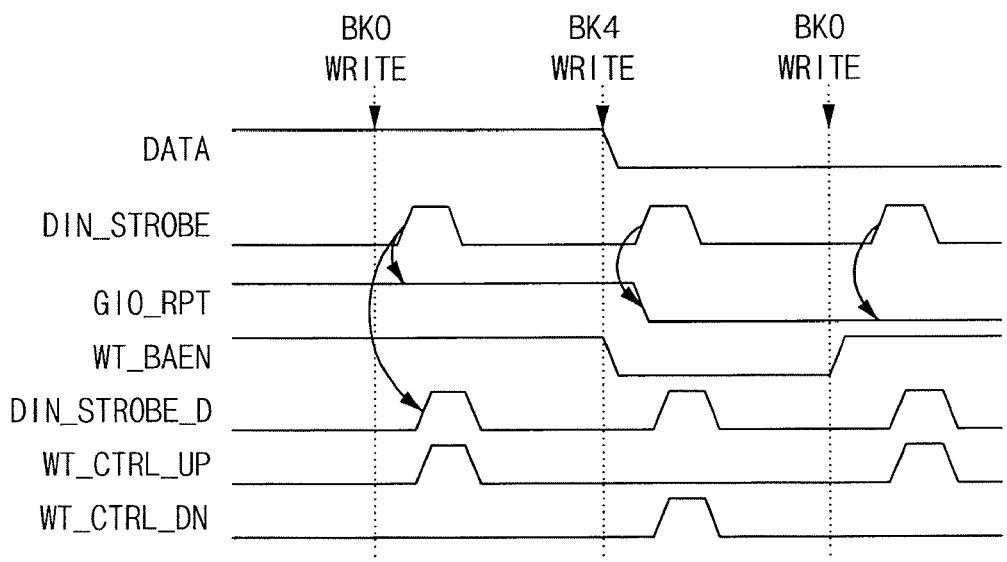
FIG. 12 is a waveform diagram illustrating states of the global input/output line GIO_RPT and the control signals WT_CTRL_UP, WT_CTRL_DN in a write operation of the semiconductor memory device of the present invention

Next, referring to FIG. 12, if a bank BK0 write command is issued by external command and address in the write operation, the data is inputted to the memory chip via the input/output pad. Herein, the input data is considered being a high level.

The input data is inputted to the repeater 32 via the global input/output line GIO_RPT when the data input strobe signal DIN_STROBE is enabled.

When the data input strobe signal DIN_STROBE is enabled, the controller 30 enables any one of the control signal WT_CTRL_UP and the control signal WT_CTRL_DN in accordance with a state of the bank control signal WT_BAEN.

Considering that the bank control signal WT_BAEN is a high level in a write operation of the bank BK0, the control signal WT_CTRL_UP is enabled when the bank control signal WT_BAEN is a high level. At this time, the control signal WT_CTRL_UP is enabled after a prescribed time since the data input strobe signal DIN_STROBE is enabled in correspondence with the delay data input strobe signal DIN_STROBE.

If the control signal WT_CTRL_UP is enabled, the data transferred from the global input/output line GIO_RPT is amplified and latched via the repeater 32 and then transferred to the up-global input/output line GIO_UP, and the data transferred to the up-global input/output line GIO_UP is amplified via the write driver WDRV0 and then transferred to the half bank BK0.

If a bank BK4 write command is issued after a prescribed time, since the write operation of bank BK0 is completed, the data is similarly inputted to the memory chip via the input/output pad. Herein, the input data is considered being a low level.

The input data is inputted to the repeater 32 via the global input/output line GIO_RPT when the data input strobe signal DIN_STROBE is enabled. The controller 30 enables the control signal WT_CTRL_DN when the data input strobe signal DIN_STROBE is enabled.

If the control signal WT_CTRL_DN is enabled, the data transferred from the global input/output line GIO_RPT is amplified and latched via the repeater 32 and then transferred to the down-global input/output line GIO_DN, and the data transferred to the down-global input/output line GIO_DN is amplified via the write driver WDRV4 and then transferred to the half bank BK4.

As described above, an embodiment of the present invention is structured such that at least two bank groups are disposed at both sides based on a center region and the global input/output line of a data input/output path is dividedly disposed to correspond to each bank group. Since the global input/output line is controllably selected to correspond to the corresponding bank group in the read operation or the write operation, it is possible to perform normal memory operation.

That is, since an embodiment of the present invention is structured such that the global input/output lines are dividedly disposed to correspond to each bank group, it is possible to reduce the length of the global input line which connects the input/output sense amplifier and the write driver with the repeater.

Therefore, since a slop of the global input/output lines is enhanced, there are advantages in that data access time can be reduced and also currents consumed by the input/output sense amplifier and the write driver connected to the global input/output line can be reduced.

Further, since the numbers of the input/output sense amplifier and of the write driver connected to the global input/output line is reduced as compared with the prior art, junction loading of the input/output sense amplifiers to the write drivers can be reduced and thus the data access time can be reduced.

Moreover, since an embodiment of the present invention can be applied to the half-bank structure, it is possible to reduce the number of the divided banks by up to ½ as compared with that of the quarter-bank structure. Therefore, since the number of the control block a controlling each bank is decreased by ½ as compared with that of the quarter-bank structure, the size of the memory chip can be reduced and also the current consumed by the control block can be reduced.

Although the present invention mentions only half-bank structure as an embodiment, the present invention may be applied to various bank structures rather than solely the half bank structure. For example, as embodiment of the present invention includes a plurality of banks, it is structured such that the banks are dividedly disposed in at least two bank groups at a distance from one another while sharing one global input/output line per one bank group. It may be controlled to select any one of the global input/output lines connected to each bank group as the data input strobe signal DIN_STROBE and the bank control signal WT_BAEN.

According to such a structure, the length of the global input/output line can be shortened, and the numbers of the input/output sense amplifier and of the write driver can be reduced, which results in high speed and low power operation.

In accordance with an embodiment of the present invention in which banks are dividedly disposed and the global input/output lines are dividedly disposed to correspond to the divided bank groups, it is possible to implement high integration since the number of control blocks controlling each divided bank is reduced and it is possible to perform high speed and low power operation since the length of the global input/output line is reduced.

Further, in accordance with an embodiment of the present invention allows reduction of the length of the global input/output line and enable high speed and low power operation in the half-bank structure, by dividedly disposing the global input/output line of a data movement path between a prescribed bank group and a repeater in a half bank structure.

Moreover, since an embodiment of the present invention can reduce the numbers of the input/output sense amplifier and of the write driver which share the global input/output line as the global input/output lines are dividedly disposed, a line loading caused by junction of the input/output sense amplifier to the write driver is reduced, whereby data processing velocity can be improved.

Moreover, an embodiment of the present invention allows the shortening of the global input/output line as the global input/output line connecting the input/output sense amplifier and the write driver with the repeater is dividedly disposed, currents consumed by the input/output sense amplifier and the write driver can be reduced.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device including a plurality of bank groups, comprising:
    a controller which generates a control signal corresponding to command and address input in read and write operation; and
    a repeater which selects any one of the plurality of bank groups by a control signal to control data transfer between the selected bank group and an input/output pad,
    wherein the controller determines a data output state of banks as read strobe signals controlling a read operation of each of the banks in the read operation to output the output signal corresponding to the bank to which the data is output.

2. The semiconductor memory device of claim 1, wherein the controller outputs the control signal corresponding to the bank to which the data is inputted by a bank control signal having bank address information when a data input strobe signal issued by command is enabled in the write operation.

3. The semiconductor memory device of claim 1, wherein the repeater comprises:
    a read repeater which transfers data provided from the bank group selected by the control signal to the input/output pad in the read operation; and
    a write repeater which transfers data provided from the input/output pad to the bank group selected by the control signal in the write operation.

4. The semiconductor memory device of claim 3, wherein the read repeater comprises:
    a first driving unit which amplifies the data transferred from the bank group selected by the control signal; and
    a first latch unit which latches a signal output by the first driving unit.

5. The semiconductor memory device of claim 4, wherein the first driving unit comprises:
    a pull-up unit which pulls up an output end connected to the first latch unit in response to data transferred from the selected bank group;
    a pull-down unit which pulls down the output end in response to data transferred from the selected bank group; and
    a switch which connects the pull-up unit and the pull-down unit with the output end respectively in response to the control signal.

6. The semiconductor memory device of claim 3, wherein the write repeater comprises:
    a driving signal generating unit which outputs a driving signal corresponding to data transferred from the input/output pad in response to the control signal;
    a second driving unit which drives the data in response to the driving signal; and
    a second latch unit which latches a signal output by the second driving unit and transfers the latched signal to the corresponding bank group.

7. The semiconductor memory device of claim 6, wherein the driving signal generating unit enables any one of a pull-up driving signal and a pull-down driving signal in correspondence with the transferred data when the control signal is enabled, and the second driving unit pulls up or pulls down a level of the transferred data in response to an output from the driving signal generating unit.

8. A semiconductor memory device including an up bank group and a down bank group, comprising:
    an up global line coupled with the up bank group;
    a down global line coupled with the down bank group;
    a controller which generates a control signal corresponding to a command and an address input in a read and a write operation; and
    a repeater which selects any one of the up bank group and the down bank group by a control signal to control a transferring of data between the selected bank group and the global line corresponding to the selected bank group,
    wherein the controller determines a data output state of banks as read strobe signals for controlling a read operation of each of the banks in the read operation to output the output signal corresponding to the bank to which the data is output.

9. The semiconductor memory device of claim 8, wherein the controller outputs the control signal corresponding to the bank to which the data is inputted by a bank control signal having bank address information when a data input strobe signal issued by command is enabled in the write operation.

10. The semiconductor memory device of claim 8, wherein the repeater comprises:
    a read repeater which transfers data provided from the bank group selected by the control signal to the global line corresponding to the selected bank group in the read operation; and
    a write repeater which transfers data provided from the global line corresponding to the selected bank group to the selected bank group by the control signal in the write operation.

11. The semiconductor memory device of claim 10, wherein the read repeater comprises:
    a first driving unit which amplifies the data transferred from the bank group selected by the control signal; and
    a first latch unit which latches a signal output by the first driving unit.

12. The semiconductor memory device of claim 11, wherein the first driving unit comprises:
    a pull-up unit which pulls up an output end connected to the first latch unit in response to data transferred from the selected bank group;
    a pull-down unit which pulls down the output end in response to data transferred from the selected bank group; and
    a switch which connects the pull-up unit and the pull-down unit with the output end respectively in response to the control signal.

13. The semiconductor memory device of claim 10, wherein the write repeater comprises:
    a driving signal generating unit which outputs a driving signal according to data transferred from the global line corresponding to the selected bank group in response to the control signal;
    a second driving unit which drives the data in response to the driving signal; and
    a second latch unit which latches a signal output by the second driving unit and transfers the latched signal to the corresponding bank group.

14. The semiconductor memory device of claim 13, wherein the driving signal generating unit enables any one of a pull-up driving signal and a pull-down driving signal in correspondence with the transferred data when the control signal is enabled, and the second driving unit pulls up or pulls down a level of the transferred data in response to an output from the driving signal generating unit.

* * * * *